United States Patent [19]
Busca et al.

[11] Patent Number: 5,838,206
[45] Date of Patent: Nov. 17, 1998

[54] ACTIVE HYDROGEN MASER ATOMIC FREQUENCY STANDARD

[75] Inventors: Giovanni Busca, Neuchâtel; Laurent-Guy Bernier, Villiers; Pascal Rochat, Marin, all of Switzerland

[73] Assignee: Observatoire Cantonal de Neuchatel, Neuchatel, Switzerland

[21] Appl. No.: 715,819

[22] Filed: Sep. 19, 1996

[30] Foreign Application Priority Data

Sep. 29, 1995 [EP] European Pat. Off. .............. 95115412

[51] Int. Cl.$^6$ ...................................... H03L 7/26
[52] U.S. Cl. ............................................. 331/3; 331/94.1
[58] Field of Search ....................... 331/3, 94.1

[56] References Cited

U.S. PATENT DOCUMENTS

| | | | |
|---|---|---|---|
| 4,449,105 | 5/1984 | Frank et al. ................................. | 331/3 |
| 4,706,042 | 11/1987 | Stein ....................................... | 331/94.1 |
| 5,146,184 | 9/1992 | Cutler ......................................... | 331/3 |

FOREIGN PATENT DOCUMENTS 2 044 521  10/1980  United Kingdom .

OTHER PUBLICATIONS

IEEE Transactions on Instrumentation and Measurement, vol. IM–36, No. 2, Jun. 1987, New York US, pp. 588–593, XP002005029 R.F.C. Vessot et al.:"A Hydrogen Maser at Temperatures Below 1 K".

*Primary Examiner*—David Mis
*Attorney, Agent, or Firm*—Griffin, Butler, Whisenhunt & Szipl

[57] ABSTRACT

An atomic maser includes a circuit (25) for effecting a shift in the frequency of a signal injected into a resonant cavity (4) so as to generate alternately a first and a second signal portion having respectively a frequency greater than and less than the natural frequency of stimulated emission, the first and second signal portions having a periodicity corresponding to a predetermined interrogation period. Circuitry (31, 32,33,51,52) is responsive to a signal detected in the cavity (4) to produce an error signal representing the difference between the amplitude of the detected signal in response to the injection of the first and second signal portions. Further circuitry (53,54) adjusts the resonant frequency of the cavity in response to the error signal. A pulse generator 26 and a mixer 28 periodically apply both the first and second signal portions for a limited duration only during the interrogation period.

10 Claims, 2 Drawing Sheets

ACTIVE HYDROGEN MASER ATOMIC FREQUENCY STANDARD

FIELD OF THE INVENTION

The present invention relates to atomic frequency standards, and more particularly to atomic frequency standards comprising a resonant cavity containing a medium capable of stimulated emission. The invention is suitable for use in active hydrogen masers and it will be convenient to hereinafter disclose the invention in relation to that exemplary application. It is to be appreciated, however, that the invention is not limited to this application. In particular, the invention is applicable to all active frequency standards, in which the stimulated emissions of the atomic medium is self-sustained, as well as to all passive frequency standards, which require external excitation.

BACKGROUND OF THE INVENTION

An atomic hydrogen maser is a type of atomic frequency standard based on the hyperfine transition of atomic hydrogen at approximately 1.4 GHz. In such masers, a beam of atomic hydrogen is firstly supplied into a vacuum chamber. This atomic hydrogen traverses a state selecting magnet and enters a storage bulb in a microwave cavity. A state selector eliminates, by divergence, the hydrogen atoms situated in the lower state (F=0, $m_F$=0) and converges the hydrogen atoms situated in the upper energy state (F=1, $m_F$=0) towards the opening of the storage bulb. This storage bulb is situated at the centre of a cylindrical microwave cavity, tuned to the frequency of the hyperfine transition of the hydrogen atoms therein. For a passive maser, in order to observe the atomic resonance of the state selected hydrogen atoms, a microwave signal is injected into the resonant cavity at the resonance frequency of the hydrogen atoms. For an active maser, conditions are such that an output signal is available at the coupling loop. This signal is provided by the atomic oscillations.

Masers corresponding to this definition are known from the prior art. In order to ensure the frequency stability of such masers, a cavity resonant frequency control circuit is used to tune the resonant cavity to the natural frequency of the stimulated emission of the medium which it contains. For a passive maser, a second control circuit, the injected interrogation signal control circuit, assures that the carrier frequency of the cavity interrogation signal is centred upon the natural frequency of the stimulated emissions. For an active manner, the atomic oscillation signal output has a frequency equal to the resonant frequency of the stimulated emissions.

In order to correctly tune the resonant cavity to the natural frequency of the stimulated emissions of the hydrogen atoms, some masers make use of using a tuning method known as the cavity frequency switching method. According to this method, a modulator switches the cavity resonant frequency between two values respectively greater and less than the natural frequency of the stimulated emission of the medium in the cavity, by applying a square wave voltage to a varactor tuning circuit coupled to the microwave cavity. The maser output level is then modulated when the average value of the cavity resonant frequency differs from the natural frequency of the stimulated emission of the medium in the cavity. After envelope detection at a microwave receiver output, and synchronous detection, an error signal is obtained. This error signal is then used to control the cavity resonant frequency.

The resonance curve of the cavity is thus interrogated at two frequencies, respectively greater and less than the natural frequency of the stimulated emission of the medium in the cavity, whilst the line of the stimulated emission from the medium contained in the resonant cavity.

Whilst such masers have been found to be suitable in many applications, the inventors have found that this tuning method nevertheless introduces a spurious signal into the resonant cavity at a frequency close to that of the natural frequency of the stimulated emissions of the medium contained therein. As a consequence, amplitude and phase noise is introduced by the resonant cavity tuning circuit which perturbs the precision of the maser signal. Such errors are unacceptable in certain applications in which a time-reference signal of extremely high precision and stability is required.

SUMMARY OF THE INVENTION

An object of the present invention is to provide an atomic frequency standard which overcomes or alleviates the disadvantages of the prior art.

Another object of the invention is to provide an atomic frequency standard which has a high degree of precision.

A further object of the invention is to provide an atomic frequency standard of simple design and construction.

With that object in mind, the present invention provides an atomic frequency standard comprising a resonant cavity containing a medium capable of stimulated emission, means for injecting into said cavity a signal with a frequency centred on the natural frequency of said stimulated emission, means for effecting a shift in the frequency of said injected signal so as to generate alternatively a first signal portion having a frequency greater than the natural frequency of said stimulated emission and a second signal portion having a frequency less than the natural frequency of said stimulated emission, said first and second signal portions having a periodicity corresponding to a predetermined interrogation period, means responsive to a signal detected in said cavity to produce an error signal representing the difference between the amplitude of said detected signal in response to the injection of said first signal portion and the amplitude of said detected signal in response to the injection of said second signal portion, and means responsive to said error signal for adjusting the resonant frequency of said cavity, characterised in that said atomic maser further comprises means for periodically applying both said first and second signal portions for a limited duration only said interrogation period.

The invention makes it possible to provide an atomic frequency standard having a degree of precision which is markedly better than in known frequency standards.

Advantageously, such a frequency standard may be achieved without the need to reduce the instantaneous power of the injected signals for tuning the cavity resonant frequency. Interrogation of the resonance curve of the cavity may therefore be performed without using extremely sensitive and complex detection circuitry.

The following description refers in more detail to the principles and various features of the atomic frequency standard of the present invention. In order to facilitate an understanding of the invention, reference is made in the description to the accompanying drawings where the invention is illustrated in a preferred embodiment. It is to be understood that the atomic frequency standard of the present invention is not limited to the preferred embodiment as illustrated in the drawings.

DESCRIPTION OF PREFERRED EMBODIMENT

Figure 1:
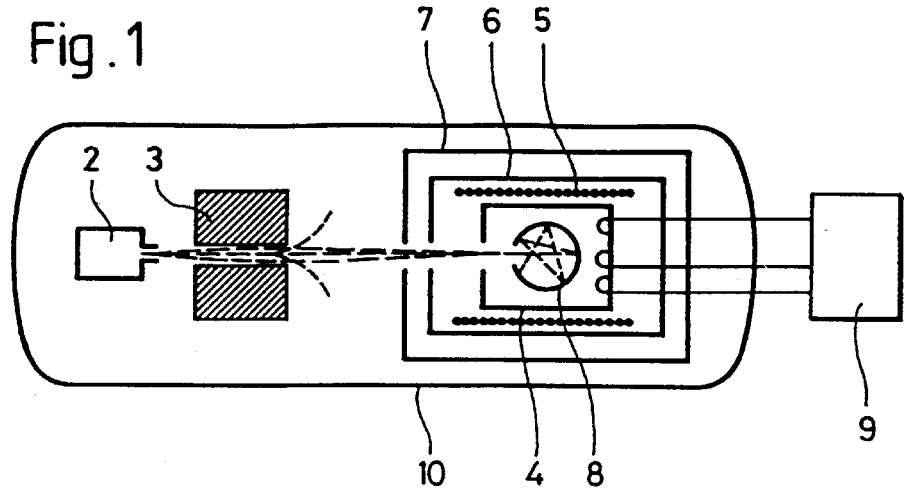
FIG. 1 is a schematic diagram showing the principles of operation of an atomic frequency standard embodying the invention.

The operating principles of one example of an atomic maser according to the present invention will now be described with reference to FIG. 1. In particular, FIG. 1 shows an atomic hydrogen maser 1 comprising a source 2 of a medium capable of stimulated emission, a state selector 3, a resonant cavity 4, a coil 5, two magnetic shields 6 and 7, a storage bulb 8 and associated control circuitry 9. The elements 2 to 7 of the atomic hydrogen maser 1 are mounted in a vacuum chamber 10.

The beam source 2 is a radio-frequency gas discharge in molecular hydrogen which produces atomic hydrogen with high efficiency. The atomic hydrogen beam leaves the source 2 through one or many channels into the vacuum chamber 10. The beam of atomic hydrogen traverses a state selecting magnet 3 and enters the storage bulb 8 in the microwave cavity 4. The state selector 3 eliminates, by divergence, the hydrogen atoms situated in the lower state (F=0, $m_F$=0) and converges the hydrogen atoms situated in the upper energy state (F=1, $m_F$=0) towards the opening of the storage bulb 8. This storage bulb 8 is situated at the centre of a cylindrical microwave cavity, tuned to the frequency of the hyperfine transition of the hydrogen atoms therein.

A connection is also effected between the control circuitry 9 and the resonant cavity 4 in order that this latter may be tuned to the natural frequency of the stimulated emissions of the hydrogen atoms in the storage bulb.

In a maser of this type, the transition frequency of the hydrogen atoms depends upon the magnetic field in the resonant cavity 4. In order to obtain an output signal having a constant predetermined frequency, the transitions of the atomic hydrogen must take place in a constant magnetic field. In order to obtain this constant magnetic field, it is necessary to shield the zone of interaction between the exterior magnetic field by means of the two magnetic shields 6 and 7 so that the value of the residual field is insignificant. The constant magnetic field is produced by the coil 5 surrounding the cavity 4 and situated inside the magnetic shields 6 and 7.

Figure 2:
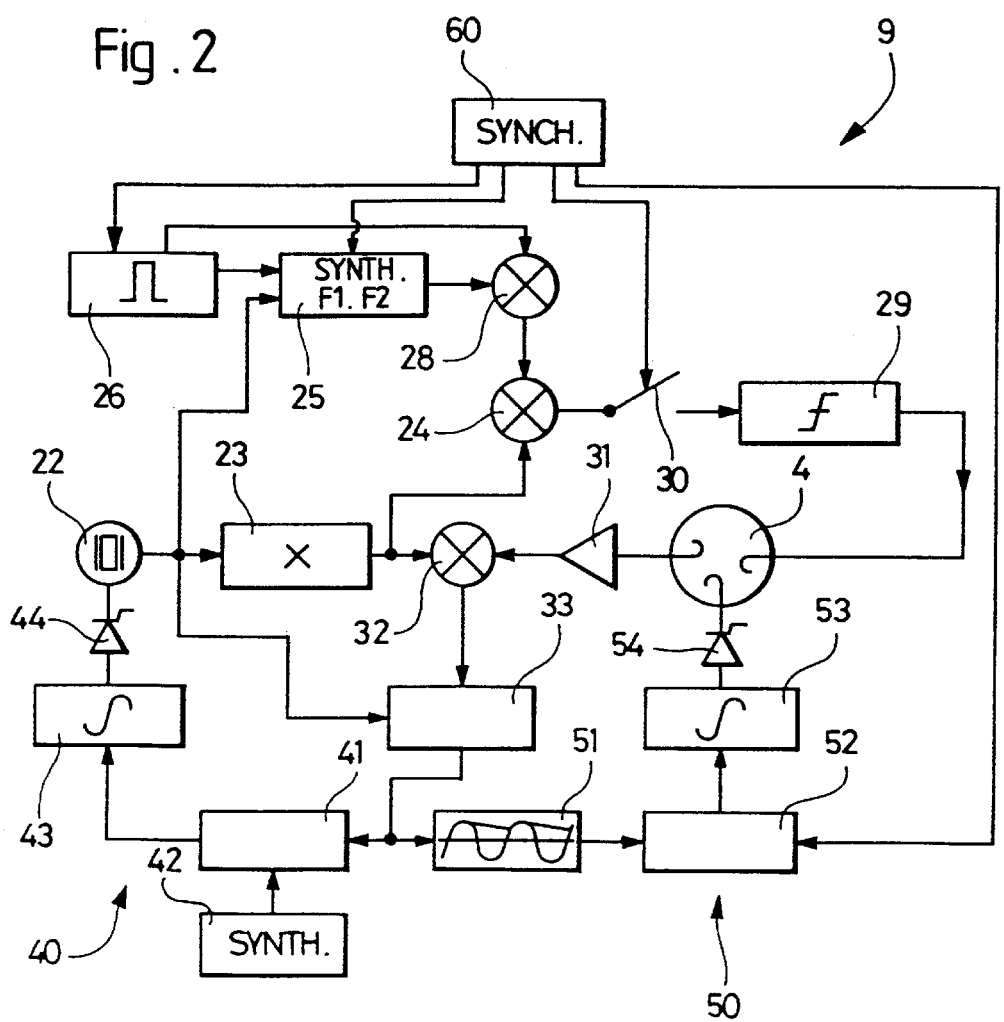
FIG. 2 is a schematic diagram of one embodiment of the control circuitry of an atomic frequency standard of FIG. 1.

Referring now to FIG. 2, there is the cavity 4 and the control circuitry 9 of the maser of FIG. 1. An oscillator circuit 22 produces a signal at a frequency of 100 MHz. This signal is applied to a frequency multiplier 23 which provides at its output a signal at a frequency of 1400 MHz.

The control circuitry 9 also includes a switchable synthesiser 25 and a pulse generator 26. The switchable synthesiser 25 selectively provides an output signal having either a frequency $f_1$ or a frequency $f_2$ such that the average of these two frequencies corresponds to the natural frequency of the stimulated emissions of the medium in the storage bulb 8. Typical values of these two frequencies in the case of an atomic hydrogen maser may be, for example, 20.420 MHz and 20.390 MHz.

The pulse generator 26 generates two series of pulses and the operation thereof will be explained in detail further below.

The outputs of the switchable synthesiser 25 and the pulse generator 26 are both applied to the inputs of a mixer 28 so that the signal generated by the switchable synthesiser 25 is modulated by the pulses from the pulse generator 26.

The outputs of the frequency multiplier 23 and the mixer 28 are applied to a mixer 24 which provides a signal whose average value is close to 1420 MHz, which is firstly amplitude limited by an attenuator circuit 29 and then introduced into the resonant cavity 4. The attenuator circuit 29 acts to limit the power of the signal injected into the resonant cavity 4.

A switch may be connected between the output of the mixer 24 and the input of the attenuator 29 for better rejection of the interrogation signal during dead times.

The resonant cavity 4 is tuned to the natural frequency $f_R$ of the stimulated emission of the medium which it contains. In the case of a hydrogen maser, the transition which gives rise to the stimulated emission is the transition from the state F=1, $m_F$=0 to the state F=0, $m_F$=0 of a hydrogen atom which is placed in a magnetic field for separating the Zeeman sub-levels $m_F$=+1 and $m_F$=−1 from the state F=0. The natural frequency $f_R$ of this transition is in the region of 1420 MHz (1420.405751 . . . MHz).

The cavity 4 can be considered as a band-pass filter whose quality factor $Q_c$ varies between 30000 and 60000, depending upon the volume of the cavity. For a quality factor of the order of 30000, the cavity with the medium which it contains can be considered as a combination of such a filter with filter having a quality factor $Q_H$ of the order of $10^9$.

An amplifier 31 receives and amplifies the maser signal. The carrier frequency of this signal firstly combined, by a mixer 32, with the signal from the output of the frequency multiplier 23 and is then down-converted by a frequency changer circuit 33 to an intermediate-frequency $f_i$. The output signal of the frequency changer circuit 33 is applied, firstly, to an oscillator control circuit 40 and, secondly, to a cavity control circuit 50.

In the control means 40 of the oscillator circuit 22, the signal supplied by the frequency changer circuit 33 is applied to a phase comparator 41 which produces an error signal corresponding to the phase difference between the output of a synthesiser 42 and the intermediate frequency from the frequency changer circuit 33.

Any phase shift results in an error signal at the output of the phase detector 41. The error signal is applied to an integrator 43 and used for controlling a variable capacitor 44 which is coupled to the oscillator circuit 22, whereby its frequency may be slightly varied for correction thereof.

In the control means 50 of the cavity 4, the output signal of the frequency changer circuit 33 is applied to an envelope detector 51. The output of this latter is received by a synchronous detector 52 which extracts the microwave signal impressed on the intermediate-frequency $f_i$ resulting from the injection into the cavity of the pulsed signal from the output of the mixer 24.

More precisely, the synchronous detector 52 measures and compares the amplitude of the detected cavity signal resulting from the injection of the signal pulses, which have been generated from a combination of the output signals of the switchable synthesiser 25 and the pulse generator 26 and which have a frequency $f_1$, with that of the detected cavity signal resulting from the injection of the signal pulses having a frequency $f_2$.

An error signal is produced from this comparison which indicates a shift in the resonance frequency of the cavity 4 with respect to the natural frequency of the stimulated emissions. The error signal is applied to an integrator 53 whose output is connected to a variable capacitor 54 which is in turn coupled to the cavity 4, whereby the resonance frequency $f_C$ of this latter may be slightly varied for correction purposes.

The control circuitry 9 further comprises a synchronisation module 60 which synchronises notably the operation of the synchronous detection circuit 52 with that of the pulse generator 26 and the switchable synthesiser 25. In addition, the synchronisation module 60 acts upon the control switch 30 so as to reject any residual signal from the mixer 24.

The basic equation for the above-described phenomenon of cavity pulling is set out in "The Quantum Physics of Atomic Frequency Standards" by Vanier and Audoin (Adam Nilger, 1989, page 1039). According to this publication, the maser frequency pulling $\Delta f_m/f_m$ caused by the interrogation of the resonant cavity is given by:

$$\frac{\Delta f_m}{f_m} = \frac{f_m}{8Q_l(f_{int} - f_m)} \times \frac{P_{cav}}{P_{at}}$$

where $f_{int}$ is the frequency of the cavity interrogation signal, $P_{cav}$ is the power inside the cavity for a given incident or interrogation power detuned by one half-bandwidth, $P_{at}$ is the atomic power inside the cavity for a given maser output power, $Q_l$ is the quality factor of the resonant cavity and $f_m$ is the maser frequency.

However, if the interrogation signal which is applied to the resonant cavity is pulsed so as to interrogate only periodically the resonant cavity, for example, in the manner described above in relation to the pulse generator 26 and the switchable synthesiser 25 of FIG. 2, this equation becomes:

$$\frac{\Delta f_m}{f_m} = \frac{f_m}{8Q_l(f_{int} - f_m)} \times \frac{P_{cav}}{P_{at}} \times 2 \frac{\tau_{ON}}{\tau}$$

where $\tau_{ON}$ is the time duration of the each of the interrogation pulses each interrogation period and $\tau$ is the time duration of that interrogation period.

From this, it can be seen that pulling of the maser frequency is a linear function of $\tau_{ON}$. It can also be seen that the pulling of the maser frequency is also directly proportional to the interrogation power applied to the resonant cavity. By appropriate setting of the duration of the interrogation pulses with respect to their periodicity, it is therefore possible to minimise the error in the maser frequency caused by the interrogation of the cavity frequency, whilst nevertheless maintaining the power of the interrogation signal at a sufficiently high level to facilitate the detection of the cavity response thereto.

Figure 3:
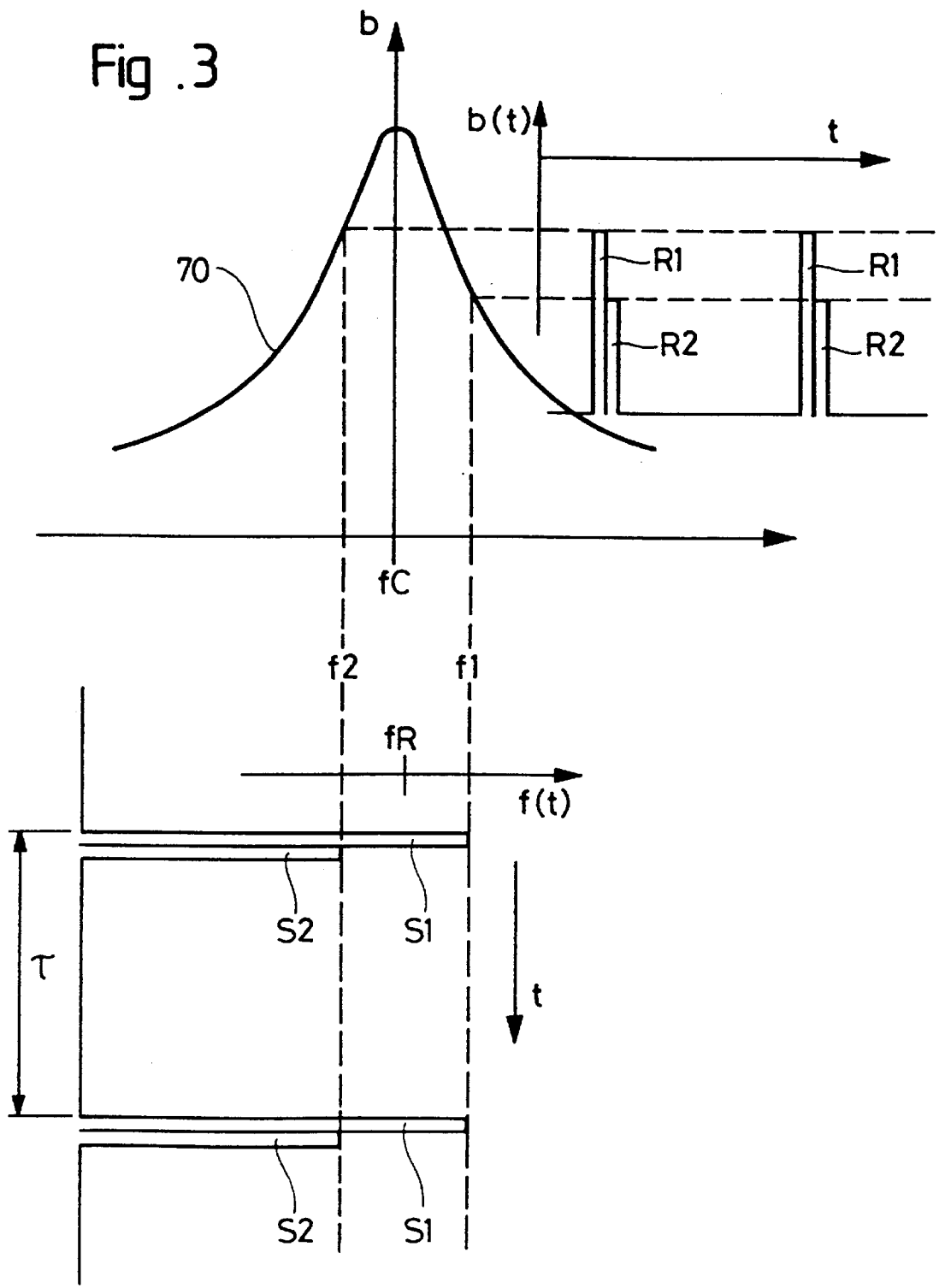
FIG. 3 shows the resonance curve of the cavity of the atomic frequency standard of FIG. 2.

The foregoing will be more clearly understood by referring to FIG. 3, which shows the resonance curve 70 of the cavity 4 of the maser 1 of FIG. 1. This curve 70 is symmetric about a peak value at its resonance frequency $f_C$.

During operation of the control circuit 9 of the maser 1, the pulse generator 26 is controlled by the synchroniser 60 so that it generates two series of pulses, respectively referenced S1 and S2. Each of these series of pulses S1 and S2 has a periodicity $\tau$ and a predetermined duration $\tau_{ON}$ which is substantially less than the period or interrogation period $\tau$. The synchroniser 60 also synchronises the operation of the switchable synthesiser 25 and the pulse generator 26 so that the series of pulses S1 have a frequency $f_1$ whilst the second series of pulses S2 have a frequency $f_2$. The switchable synthesiser 25 is adapted so that the two frequencies $f_1$ and $f_2$ are centred on, and are therefore symmetrical about, the natural frequency $f_R$ of the stimulated emissions of the medium stored in the storage bulb 8.

The response of the resonant cavity 4 to each of the series of pulses S1 and S2 is respectively referenced R1 and R2. As can be seen, the amplitude b(t) of the cavity response, and hence the amplitude of the signal detected by the synchronous detection circuit 52 in response to the series of pulses S1 and S2, depends respectively upon the value of the frequencies $f_1$ and $f_2$. If the average of these two frequencies corresponds to the resonant frequency $f_C$ of the cavity 4, this latter will be tuned to the natural frequency of the stimulated emissions of the medium stored in the storage bulb 8 and the amplitude of the responses R1 and R2 will be identical. Accordingly, the value of the error signal generated at the output of the synchronous detection circuit 52 will be zero.

If, however, the average of these two frequencies differs from the frequency at which the cavity 4 resonates, as shown in FIG. 3, the amplitude of the responses R1 and R2 will be different. This difference indicates that the resonant frequency $f_C$ of the cavity 4 is not tuned to the natural frequency $f_R$ of the stimulated emissions of the medium stored in the storage bulb 8. In response to the comparison of the amplitudes of R1 and R2 effectuated by the synchronous detection circuit 52, the value of the error signal generated at the output thereof will be non-zero. This error signal will be integrated by the integrator circuit 53 and applied to the variable capacitor 54 so as to correct the resonant frequency of the cavity 4.

As will be understood from FIG. 3, the present invention concentrates the power of the cavity interrogation signal into two signal portions, in this case the pulses S1 and S2, which are each applied for a limited duration only of each interrogation period $\tau$. Accordingly, a high precision maser is obtained whilst nevertheless maintaining the instantaneous power of the interrogation signal injected into the resonant cavity at a level sufficient to ensure the correct operation of the cavity control circuit 50.

Whilst the pulses in the series S1 and S2 are shown in FIG. 3 as being contiguous, it is preferable in practice that they be separated by at least a minimum settling time. This latter should be sufficient to enable the signal resulting from the response R1 and detected by the synchronous detection circuit 52 to have settled prior to the detection of the signal resulting from the response R2.

Finally, it is to be understood that various modifications and/or additions may be made to the communication apparatus without departing from the ambit of the present invention as defined in the claims appended hereto.

We claim:

1. Atomic maser comprising:
   a resonant cavity (4) containing a medium capable of stimulated emission,
   means (22,23,24,29) for injecting into said cavity (4) a signal with a frequency ($f_1$, $f_2$) centred on the natural frequency ($f_R$) of said stimulated emission,
   means (25) for effecting a shift in the frequency of said injected signal so as to generate alternatively a first signal portion having a frequency ($f_1$) greater than the natural frequency ($f_R$) of said stimulated emission and a second signal portion having a frequency ($f_2$) less than the natural frequency ($f_R$) of said stimulated emission, said first and second signal portions having a periodicity ($\tau$) corresponding to a predetermined interrogation period,
   means (31,32,33,51,52) responsive to a signal detected in said cavity (4) to produce an error signal representing the difference between the amplitude of said detected signal (R1) in response to the injection of said first signal portion and the amplitude of said detected signal (R2) in response to the injection of said second signal portion, and
   means (53,54) responsive to said error signal for adjusting the resonant frequency ($f_C$) of said cavity, characterised in that said atomic maser further comprises means (26,28) for periodically applying both said first and second signal portions for a limited duration only ($\tau_{ON}$) during said interrogation period.

2. Atomic maser according to claim 1, characterised in that said means (26,28) for periodically applying both said first and second signal portions comprise pulse generating means (26) for generating a first and a second series of pulses (S1,S2) such that each of said series of pulses has a periodicity ($\tau$) corresponding to said interrogation period and such that each of said pulses has a predetermined duration ($\tau_{ON}$) substantially less than said interrogation period, and means (28) for modulating said pulses with said injected signal.

3. Atomic maser according to claim 2, characterised in that it further comprises means (60) for synchronising said frequency shifting means (25) and said pulse generating means (26) so as to generate a series of pulses (S1) of said first signal portion and a series of pulses (S2) of said second signal portion.

4. Atomic maser according to claim 1, characterised in that said means (25) for effecting a shift in the frequency of said injected signal comprise a programmable frequency synthesiser.

5. Atomic maser according to claim 1, characterised in that said means (26,28) for periodically applying both said first and second signal portions are adapted to separate said first and second signal portions by at least a minimum settling time.

6. Atomic maser according to claim 2, characterized in that said means (25) for effecting a shift in the frequency of said injected signal comprise a programmable frequency synthesizer.

7. Atomic maser according to claim 3, characterized in that said means (25) for effecting a shift in the frequency of said injected signal comprise a programmable frequency synthesizer.

8. Atomic maser according to claim 2, characterized in that said means (26, 28) for periodically applying both said first and second signal portions are adapted to separate said first and second signal portions by at least a minimum settling time.

9. Atomic maser according to claim 3, characterized in that said means (26, 28) for periodically applying both said first and second signal portions are adapted to separate said first and second signal portions by at least a minimum settling time.

10. Atomic maser according to claim 4, characterized in that said means (26, 28) for periodically applying both said first and second signal portions are adapted to separate said first and second signal portions by at least a minimum settling time.

* * * * *